(12) United States Patent
Jiao et al.

(10) Patent No.: US 10,027,322 B2
(45) Date of Patent: Jul. 17, 2018

(54) INTERDIGITATED CAPACITIVE PROXIMITY SENSOR WITH VARIED SPACE ELECTRODE STRUCTURE

(71) Applicant: Beijing University of Technology, Beijing (CN)

(72) Inventors: Jingpin Jiao, Beijing (CN); Liang Li, Beijing (CN); Nan Li, Beijing (CN); Cunfu He, Beijing (CN); Bin Wu, Beijing (CN)

(73) Assignee: Beijing University of Technology, Beijing (CN)

( * ) Notice: Subject to any disclaimer, the term of this patent is extended or adjusted under 35 U.S.C. 154(b) by 0 days.

(21) Appl. No.: 15/520,054

(22) PCT Filed: May 16, 2016

(86) PCT No.: PCT/CN2016/082195
§ 371 (c)(1),
(2) Date: Apr. 18, 2017

(87) PCT Pub. No.: WO2017/054461
PCT Pub. Date: Apr. 6, 2017

(65) Prior Publication Data
US 2017/0331474 A1 Nov. 16, 2017

(30) Foreign Application Priority Data

Sep. 29, 2015 (CN) .......................... 2015 1 0639121

(51) Int. Cl.
*H03K 17/955* (2006.01)
*G01R 27/26* (2006.01)
(Continued)

(52) U.S. Cl.
CPC ......... *H03K 17/955* (2013.01); *B60R 19/483* (2013.01); *G01B 7/023* (2013.01); *G01D 5/24* (2013.01); *G01R 27/2605* (2013.01)

(58) Field of Classification Search
None
See application file for complete search history.

(56) References Cited

U.S. PATENT DOCUMENTS

| | | | |
|---|---|---|---|
| 5,537,872 A * | 7/1996 | Frere .................. | G01C 19/5621 73/504.12 |
| 8,829,928 B2 * | 9/2014 | Gonzalez ................. | G01N 1/12 324/658 |

(Continued)

FOREIGN PATENT DOCUMENTS

| CN | 101156034 A | 4/2008 |
|---|---|---|
| CN | 105158582 A | 12/2015 |

*Primary Examiner* — Jermele M Hollington
*Assistant Examiner* — Douglas X Rodriguez
(74) *Attorney, Agent, or Firm* — Zhihua Han; Le Tian

(57) ABSTRACT

Embodiments related to a capacitive proximity sensor with a variable spacing electrode structure, which is suited to a non-destructive testing operation, such as the detection of dielectric properties of the polymer materials with a thickness decreases gradually structure. The designed sensor includes a driving electrode, a sensing electrode, a substrate, a guarding electrode and a lead connector. The driving and sensing electrodes include several interdigitated fingers, which are arranged alternately in sequence, based on the characteristic of the thickness decreases gradually structure of the MUT, the width of the electrodes and spacing between two adjacent electrodes in each unit are optimized individually. Namely, under the condition of ensuring penetration depth, the electrode width is made as large as possible to achieve maximum signal strength and detection sensitivity. Compared with the traditional ES-IDE structure capacitive proximity sensor, the newly designed VS-IDE capacitive (Continued)

sensor increases the effective electrode area, which increases the signal strength and measurement sensitivity directly. Besides, the electric field lines of the designed sensor are confined within the thickness gradually changed materials under test mostly as expected simultaneously.

2 Claims, 11 Drawing Sheets

(51) Int. Cl.
*G01D 5/24* (2006.01)
*G01B 7/02* (2006.01)
*B60R 19/48* (2006.01)

(56) References Cited

U.S. PATENT DOCUMENTS

| | | | | |
|---|---|---|---|---|
| 2011/0146400 A1* | 6/2011 | Humbert | ............. | G01N 27/223 73/335.04 |
| 2011/0185810 A1* | 8/2011 | Humbert | ............. | G01N 27/223 73/335.04 |
| 2014/0197851 A1* | 7/2014 | Astley | ................... | G01R 27/02 324/660 |
| 2015/0338246 A1* | 11/2015 | Robert | ..................... | H01G 5/14 324/661 |
| 2017/0307413 A1* | 10/2017 | Yamai | ..................... | G01D 5/24 |

\* cited by examiner

INTERDIGITATED CAPACITIVE PROXIMITY SENSOR WITH VARIED SPACE ELECTRODE STRUCTURE

CROSS REFERENCE TO RELATED APPLICATION

This application is a national stage application of International application number PCT/CN2016/082195, filed May 16, 2016, titled "An Interdigitated Capacitive Proximity Sensor with Varied Space Electrode Structure," which claims the priority benefit of Chinese Patent Application No. 201510639121.5, filed on Sep. 29, 2015, which is hereby incorporated by reference in its entirety.

TECHNICAL FIELD

The present disclosure relates to a novel capacitive proximity sensor and, more particularly, to a varied space electrode structure, which is suited to a non-destructive testing operation, such as the detection of dielectric properties of a polymer material structure of which thickness gradually decreases.

BACKGROUND

Polymer materials are being increasingly used in various engineering applications due to their multiple advantages over traditional metallic materials. Their light weight, high plasticity, corrosion resistance and good insulation are being exploited for applications in the basic support components of instrument board, municipal water supply pipelines network, and insulation parts in the electrical power system, etc. However, polymer materials are always exposed to a variety of degrading influences during normal services, such as extreme temperature, light rays, and oxidation, failures caused by the degradation usually occur. Take the composite insulators which are widely used in the power supply system, for example; the external insulation part is made of high-temperature vulcanization silicone rubber (HTVSR), which is a typical polymer material. To ensure the self-cleaning ability of the composite insulators under contaminated conditions, the umbrella skirt structure is designed to be an inclined plane with a certain angle, whose thickness decreases gradually from nearby of the fiberglass reinforced resin rod to the edge of the umbrella skirt. Under the integrated effects of high voltage surge and environmental factors over extended periods of service, irreversible aging of the HTVSR material occurs. Aging of the composite insulators will lead to an electrical property degradation of the external insulation, which is a serious potential threat to the safe and stable running of the high voltage power grid. Therefore, it is necessary to develop non-destructive testing (NDT) methods for aging damage detection of polymer materials. Especially for the thickness gradually changed structure aging damage detection has significant engineering application values.

Various testing techniques such as the visual inspection, the tensile test method, and infrared spectroscopic analysis are used for the characterization of aging damage degrees of polymer materials. Generally, it is difficult to evaluate the material performance based on the appearance of materials, mechanical properties and its molecular structure. In addition, the above-mentioned methods can not directly characterize the dielectric and insulation properties of polymer materials. Capacitive proximity sensors are newly developed sensing technique based on the fringing effect of the electric field. Capacitance variation caused by the relative dielectric permittivity changed is closely related to the electrical properties of the polymer materials and can be utilized to detect and evaluate the electrical performance of dielectric structures with low conductivity. Compared with the traditional parallel-plate capacitor, capacitive proximity sensors are widely used for a variety of parameters measurement attribute to their features: high sensitivity, non-invasive, and the planar structure that is particularly useful when the access to a test specimen is limited to the only one side. Therefore, they have been widely used in many fields, such as material property monitoring, damage detecting, humidity sensing, electrical insulation properties sensing, chemical sensing, and bio-sensing, etc.

The capacitive proximity sensor is mainly composed of a driving electrode, a sensing electrode, a shielding layer, and a substrate. Existing research indicates that capacitive sensor performances such as signal strength, penetration depth, sensitivity, and noise-to-signal ratio are greatly influenced by the patterns and parameters of the electrodes, which affect the detecting capability of capacitive proximity sensors.

Many efforts have been devoted to improving the performance of capacitive proximity sensors. Several sensor patterns including square-shaped, maze, spiral and comb patterns were investigated by LI (Design principles for multichannel fringing electric field sensors [J]. Sensors Journal, IEEE, 2006, 6(2): 434-440), and it was demonstrated that complex sensor patterns could increase the effective electrode area and then improve sensor signal and sensitivity. A capacitive sensor of interdigitated electrode structure with increased height was fabricated for humidity measurement (Kim J H, Moon B M, Hong S M. Capacitive humidity sensors based on a newly designed interdigitated electrode structure [J]. Microsystem technologies, 2012, 18(1): 31-35). Compared to the traditional interdigitated electrode sensor, the proposed sensor showed higher sensitivity owe to the horizontal electric field lines confined in the polyimide sensing layer. To improve signal strength and sensitivity, Rivadeneyra et al. (Rivadeneyra A, Fernandez-Salmeron J, Banqueri J, et al. A novel electrode structure compared with interdigitated electrodes as capacitive sensor [J]. Sensors and Actuators B: Chemical, 2014, 204: 552-560) designed a serpentine structure which is a combination of meandering and interdigitated electrodes. Compared with the traditional interdigitated sensor, the signal strength of the sensor increased by 28%.

Existed research works indicated that there is a restriction relationship among the signal strength, sensor sensitivity and penetration depth for capacitive sensors; so in practical applications, a tradeoff of the sensors' properties need to be considered in the actual sensor designing process. Anything else, the structures designing and parameters optimizing of the capacitive sensor existed in previous research works are all based on the equal thickness structure. Thus the spacing between two adjacent electrodes of conventional interdigitated electrode (IDE) structure sensors is equal. For conventional IDE sensors, the penetration depths of the electric field between two adjacent electrodes are approximately equal, and the sensor is not suitable for the detection of the thickness gradually changed the structure. Aiming at the dielectric property inspection for a thickness decreases gradually structure such as umbrella skirt on the composite insulators, it is intended to design an improved IDE structure sensor which spacing between two adjacent electrodes are not equal, and the electric field of the newly designed sensor is confined within the cross section of the material under test (MUT). The optimal design of the interdigitated capacitive sensor with variable spacing electrode structure is rarely reported.

SUMMARY

A novel capacitive proximity sensors with variable spacing interdigitated electrode (VS-IDE) structure is designed for dielectric property testing of thickness gradient polymer materials samples. The present disclosure is to divide the conventional equal spacing interdigitated electrode (ES-IDE) structure sensor into several pairs of adjacent interdigitated units, based on the characteristic of the thickness decreases gradually structure of the MUT, the width of the electrodes and spacing between two adjacent electrodes in each unit are optimized individually. Finally, by combining the different interdigitated units together according to the pre-defined rule, a VS-IDE structure capacitive sensor is designed, through which electric field lines are confined within the MUT mostly as expected. Beyond that, the signal strength and the measurement sensitivity are also improved.

To achieve the above-mentioned destination, the technical proposal adopted in the disclosure is as follows.

A novel capacitive proximity interdigitated sensor may include VS-IDE structure is shown in the FIG. 1, which including driving electrode (1), sensing electrode (2), the substrate (3), guarding electrode (4), and lead connector (5). The driving electrode (1) and the sensing electrode (2) are deposited on a PMMA (polymethyl methacrylate) substrate (3), while the guarding electrode (4) is deposited on the opposite side of the substrate to protect the sensor out of the influence of surround. The lead connector (5) is welded on the guarding plane to provide a reliable connect for the sensor and testing equipment.

Both the driving and sensing electrodes may include several interdigitated fingers, which are arranged alternately in sequence, and the width and metallization ratio for each interdigitated unit are determined by the local thickness of the test sample. The arrangement of electrodes is shown in FIG. 3.

The substrate (3) is a kind of insulation material with a certain strength and stiffness to support the electrode and guarding layer. A through hole is drilled on a substrate (3) for the purpose to lead the driving electrode (1) and the sensing electrode (2) to the reverse side of the substrate (3).

As shown in FIG. 3, guarding electrode (4) is deposited on the opposite side of the substrate (3), a "U" pattern slot is reserved on the guarding electrode (4) beside the connectors of the driving electrode (1) and the sensing electrode (2). The guarding electrode (4) is deposited on the opposite side of the substrate, and the arrangement is suited to the driving electrode (1) and the sensing electrode (2).

As shown in FIG. 1, the middle pins of the SMB connectors are respectively connected to the driving electrode and the sensing electrode through the pre-reserved holes on the substrate. The outside pins of the SMB connectors (5) are connected to the guarding layer 4.

The detailed procedures about how to decide each single interdigitated unit width and space of the above-mentioned VS-IDE sensors are presented as following.

The fundamental parameters of interdigitated electrode structure are illustrated in FIG. 4, including the mainly unit width of each finger w, the length of the interdigitated electrode structure l, the spacing between two adjacent fingers g, the metallization ratio γ. The parameter C named width of a basic interdigitated unit. Likewise, the metallization ratio γ is equal to the ratio of the finger width w to the basic interdigitated unit width C, which is γ=w/(w+g).

Step 1: The capacitive proximity interdigitated sensor with a single unit as shown in FIG. 4 is fabricated, whose basic unit width is C, and the metallization ratio is γ. The proximity interdigitated sensor with single unit mainly including a driving electrode, a sensing electrode, substrate and guarding electrode. According to the sensor structure illustrated in FIG. 4, the capacitive proximity sensor is fabricated, whose electrode width is w=C*γ, and spacing between two adjacent electrodes is g=C*(1−γ), and the guarding layer width is C.

Step 2: Measuring the capacitance values in the case of different thickness MUT. A series of different thickness MUT are placed on the sensor surface fabricated in step 1 respectively, and the relevant capacitance is recorded simultaneously.

Step 3: Computing the relative capacitance ratio to the constant value at each different MUT thickness. The evaluation of the penetration depth is according to the distribution of the relative capacitance ratio d %, which can be represented as $$d\% = \frac{|C_h - C_{h\to\infty}|}{C_{h\to\infty}} \times 100\%, \quad (1)$$

wherein $C_{h\to\infty}$ is the stable capacitance at the same metallization ratio. The relative capacitance ratio curves are obtained.

Step 4: Compute the penetration depth curves of the proximity interdigitated sensors with a single unit. Based on Step 3, a horizontal line equals to 10% is drawn, and the effective penetration depth corresponds to the position where the relative capacitance equals 10%.

Step 5: Repeating the above steps 1 to 4, and the effective penetration depth curves for the proximity interdigitated sensors with a single unit, whose unit width, and metallization ratio are C and γ, respectively.

Step 6: The width and spacing of each interdigitated unit are determined, and a novel structure interdigitated proximity capacitive sensor with a variable spacing electrode is obtained. According to the correspondence between the effective penetration depth h, the length of each unit and metallization ratio of the electrode, combined with the characteristic of the thickness decreases structure of the MUT gradually, the width of the electrodes and spacing between two adjacent electrodes in each unit are optimized individually. Finally, by combining the different interdigitated units together according to the pre-defined rule, the novel VS-IDE structure capacitive sensors are designed, and the novel structure is shown in the FIG. 1.

Step 7: Optimizing selection of the proximity interdigitated sensors with varied space electrode. The sensor's performance of the different combinations obtained in step are tested, and the optimal VS-IDE structure sensor is chosen according to the comparison of the electric field line distribution and signal strength between different combinations.

The present disclosure has the following advantages. 1) Under the same detection area conditions, the effective electrode area of the VS-IDE structure sensor is increased and increased the signal strength directly. The electric field line distribution of the designed sensors is confined within the thickness gradually changed materials under test mostly as expected simultaneously. 2) Capacitive sensing is ideally suited for characterization of dielectric materials due to the close relationship between the measured capacitance and the relative permittivity (dielectric constant) of the material. And the capacitive sensing technique has the advantage of high sensitivity and non-invasive etc. 3) Without the need for destructive testing of materials, to achieve a true sense of the nondestructive testing, and can achieve continuous on-line monitoring.

As shown in the figures above, the following numbers refer to one or more components, respectively: 1. A driving electrode; 2. a sensing electrode; 3. a substrate; 4. a guarding layer; 5. a lead connector; 6. a thickness gradually changed testing specimen; 7. an impedance analyzer; 8. a VS-IDE sensor.

DETAILED DESCRIPTION OF THE PREFERRED EMBODIMENTS

The design of a VS-IDE capacitive proximity sensor is further described below with reference to FIGS. 1 to 11.

Based on the fringing effect of the electric field, a novel capacitive sensor with variable spacing electrode structure is designed and used to evaluate the dielectric properties of the polymer materials with thickness decreases gradually structure.

Figure 1:
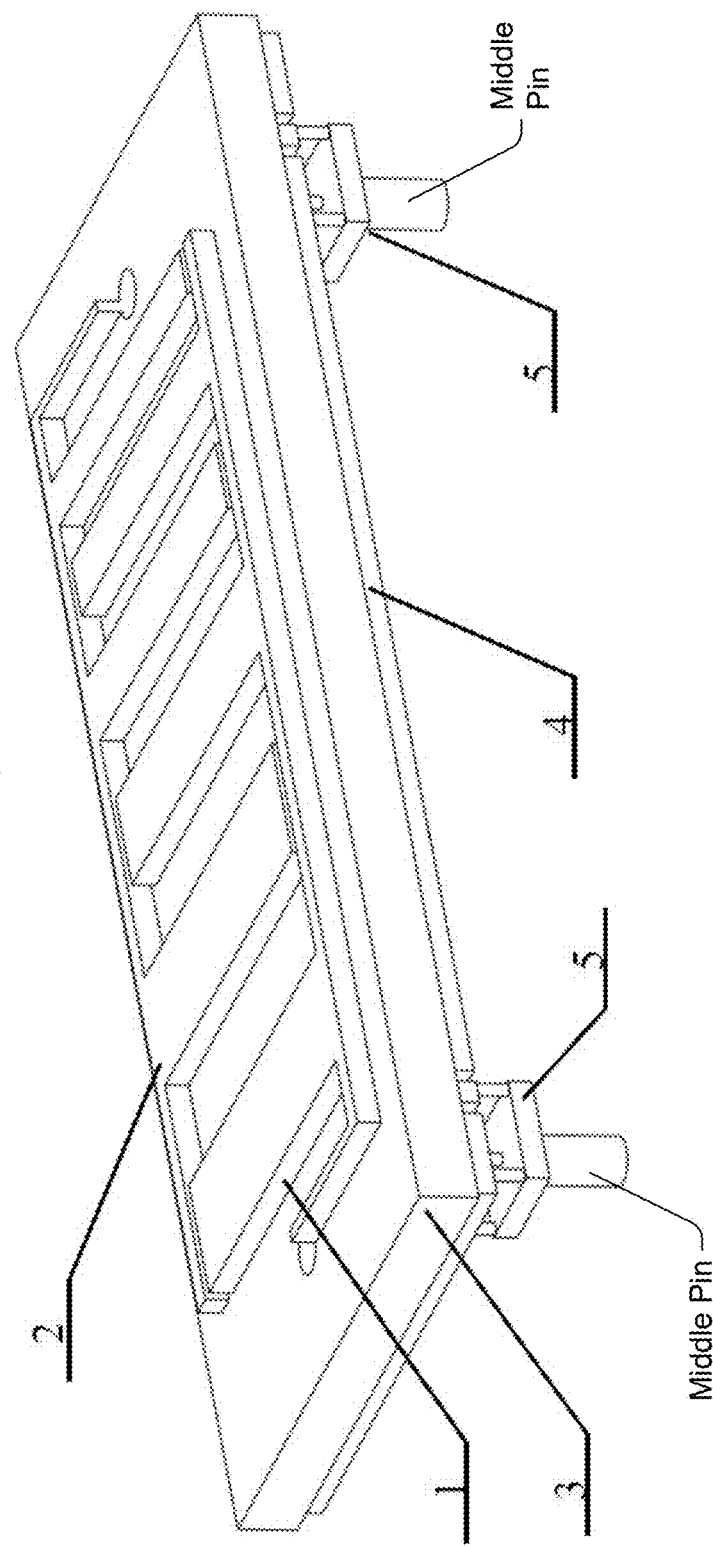
FIG. 1 is a schematic diagram of the invented VS-IDE capacitive sensor.
Figure 2:
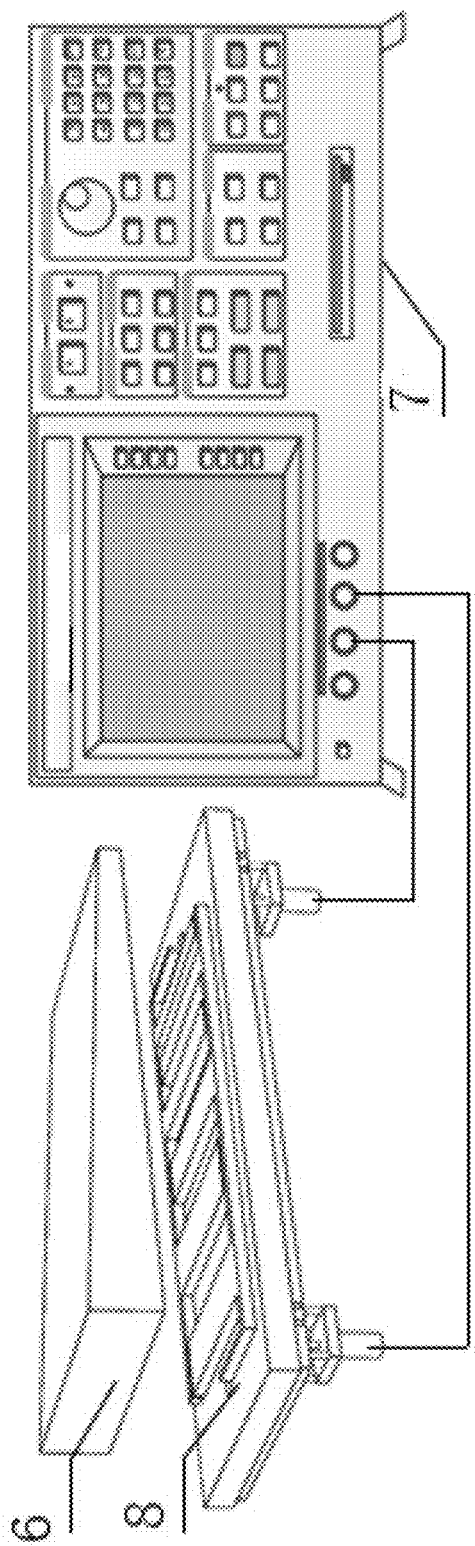
FIG. 2 is a schematic of experimental system for capacitance measurement
Figure 3:
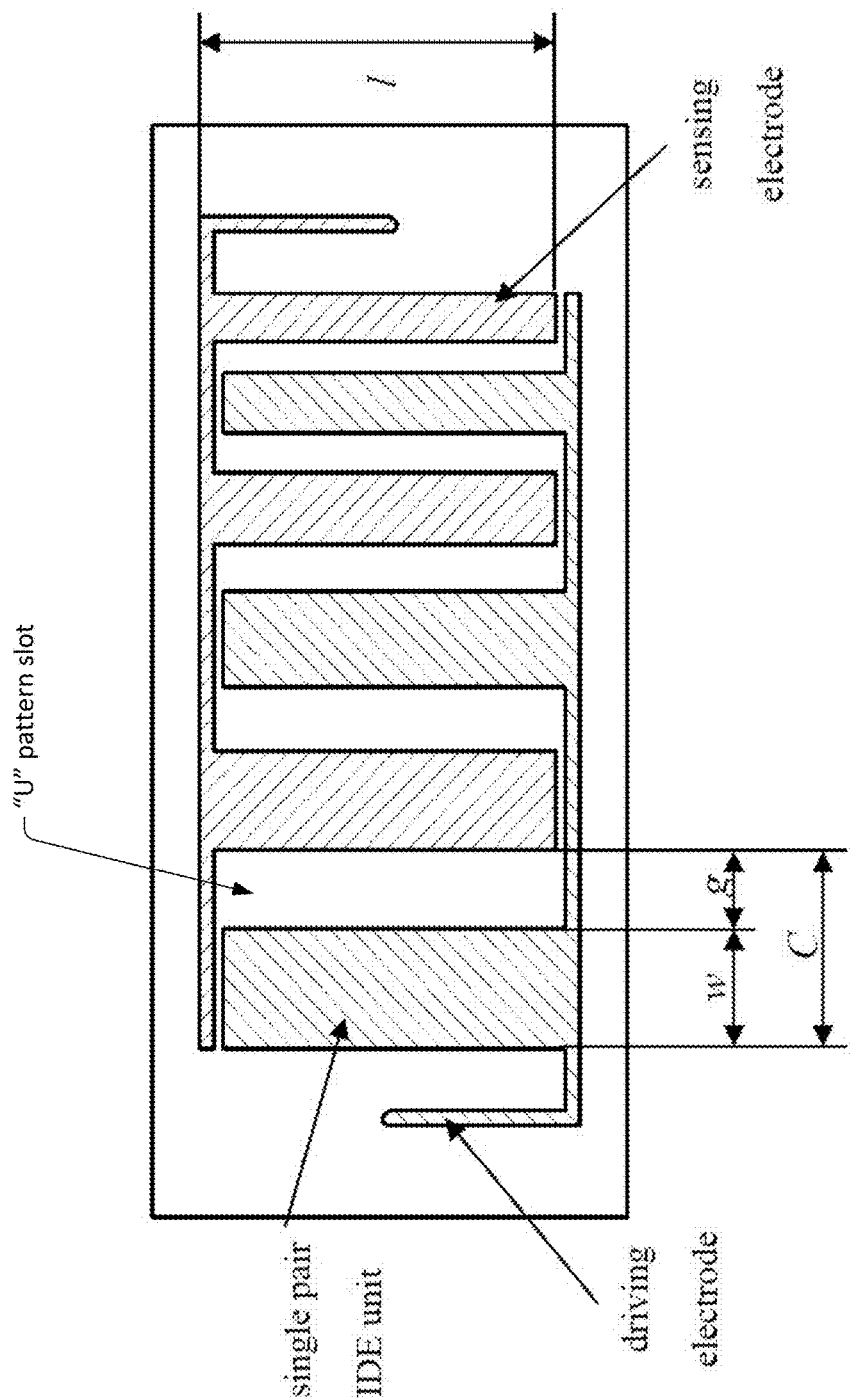
FIG. 3 shows electrode arrangement and the sign of the key parameters of VS-IDE capacitive sensor.
Figure 4:
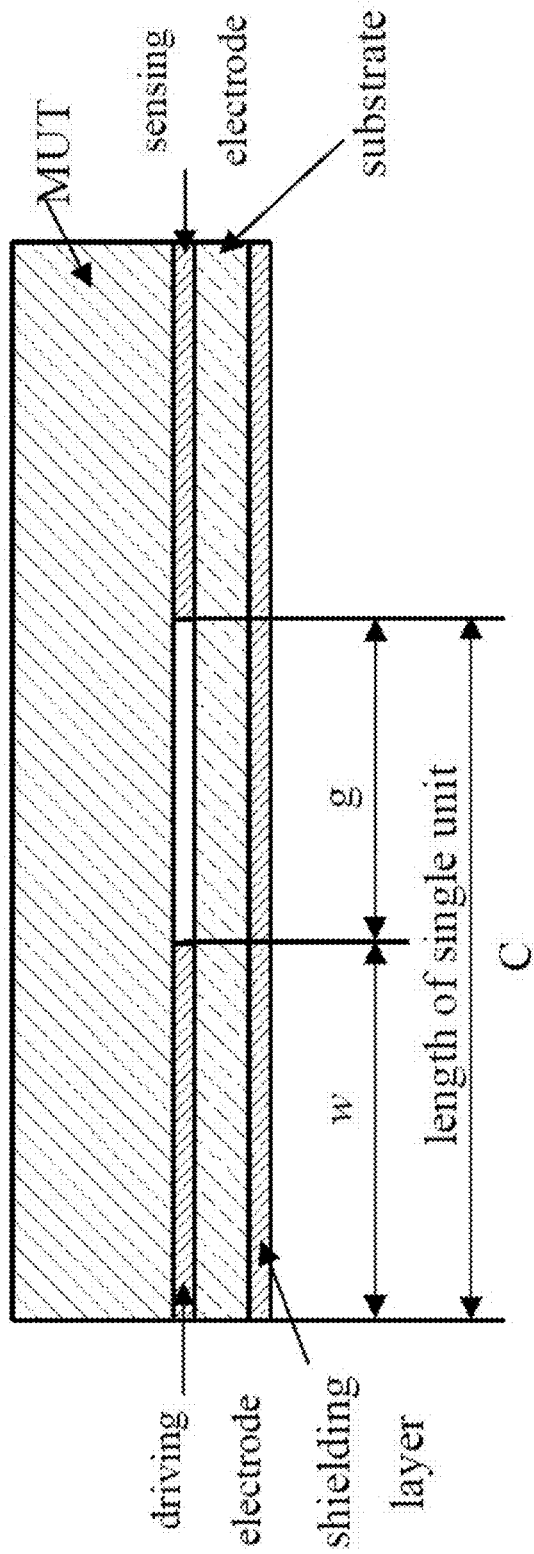
FIG. 4 is a cross section diagram of the capacitive proximity sensor with a single unit.
Figure 5:
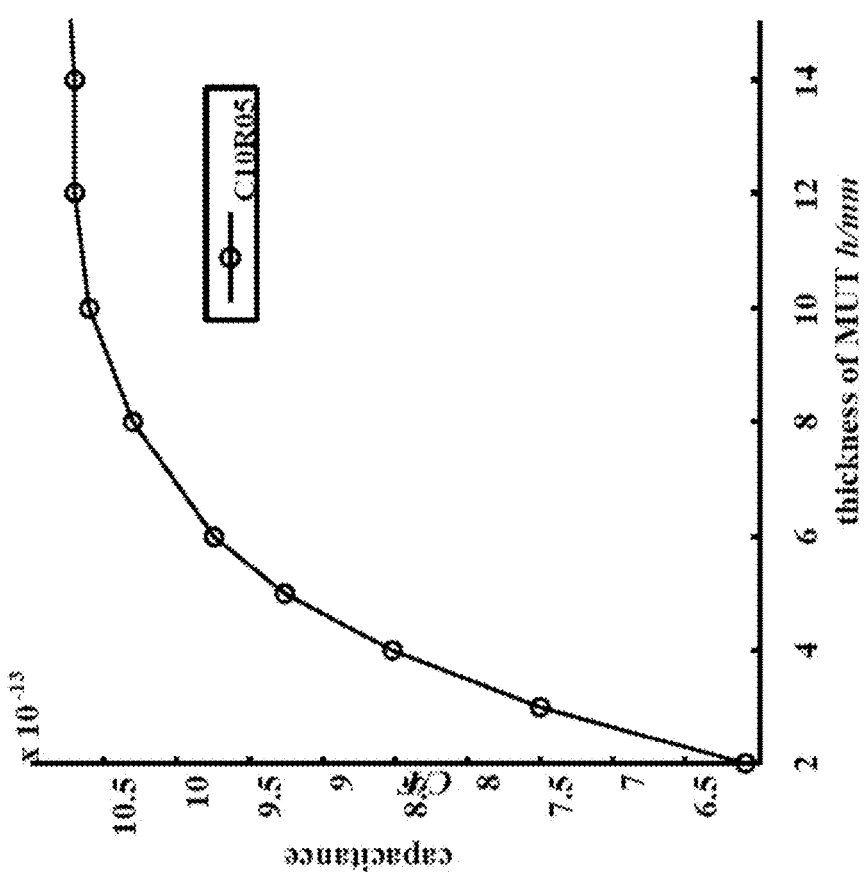
FIG. 5 shows capacitance value versus thickness of test samples for proximity interdigitated sensor with a single unit, whose metallization ratio is 0.5 and a vary unit width C.

A novel capacitive proximity interdigitated sensor may include VS-IDE structure is shown in FIG. 1, which including driving electrode (1), sensing electrode (2), substrate (3), guarding electrode (4), and lead connector (5). The driving electrode (1) and the sensing electrode (2) are deposited on a PMMA (polymethyl methacrylate) substrate (3), while the guarding electrode (4) is deposited on the opposite side of the substrate to protect the sensor out of the influence of surround. The lead connector (5) is welded on the guarding plane to provide a reliable connect for the sensor and testing equipment.

As described in FIG. 1, the driving electrode 1 and the sensing electrode 2 were made of a highly conductive copper foil having a thickness of 0.1 mm. The driving electrode 1 and the sensing electrode 2 have a width of 40 mm and a total length of 38 mm respectively. Both the driving electrode 1 and the sensing electrode 2 may include three interdigitated fingers, which are arranged alternately in sequence.

The substrate 3 was made of a PMMA plate having a size of 60*50*2.5 mm, and two diameters of 2 mm holes were obtained at a distance of 10 mm from the left and right end faces respectively. A copper foil with a width of 2 mm was selected as the lead, the driving electrode 1 and the sensing electrode 2 are led to the back surface of the substrate by a lead wire, so as to be easily connected to the lead connector 5.

As shown in the FIG. 1, guarding electrode (4) is deposited on the opposite side of the substrate (3), the guarding layer is made of a highly conductive copper foil having a thickness of 0.1 mm, and the length and width are 60 mm and 50 mm respectively. The width of the U-shaped cutout on the guarding layer is 4 mm, and the length is 30 mm, the position of the shield is opposed to the driving electrode 1 and the sensing electrode 2.

As shown in the FIG. 1, the lead connector 5 is welded to the back of the substrate 3, the middle pins of the SMB connectors (5) are respectively connected to the leads of the driving electrodes 1 and the sensing electrodes 2, and the outer pins of the lead terminals 5 are connected to the shield layer 4.

The detailed procedures about how to decide each single interdigitated unit width and space of the above-mentioned VS-IDE sensors are presented as following.

Step 1: Fabrication of the capacitive proximity interdigitated sensor with a single unit, whose basic unit width C is 10 mm and the metallization ratio γ is 0.5. According to the sensor structure illustrated in FIG. 4, the capacitive proximity sensor is fabricated, whose electrode width is 5 mm, and spacing between two adjacent electrodes is 5 mm, and the length is 40 mm.

Step 2: Measuring the capacitance values in the case of different thickness MUT. A 1 mm, thick high-temperature vulcanized silicone rubber slice, is placed above the capacitive proximity sensor fabricated in step 1, and the capacitance value measured at that time was recorded. Then, a silicone rubber sheet having a thickness of 1 mm was superimposed on each layer, and the capacitance value measured after increasing the thickness of 1 mm was recorded. Finally, the capacitance value varies with the thickness of the silicone rubber curve shown in FIG. 5 can be obtained. It can be seen from FIG. 5 that the measured capacitance tends to steady state when the silicon rubber thick is 14 mm.

Figure 6:
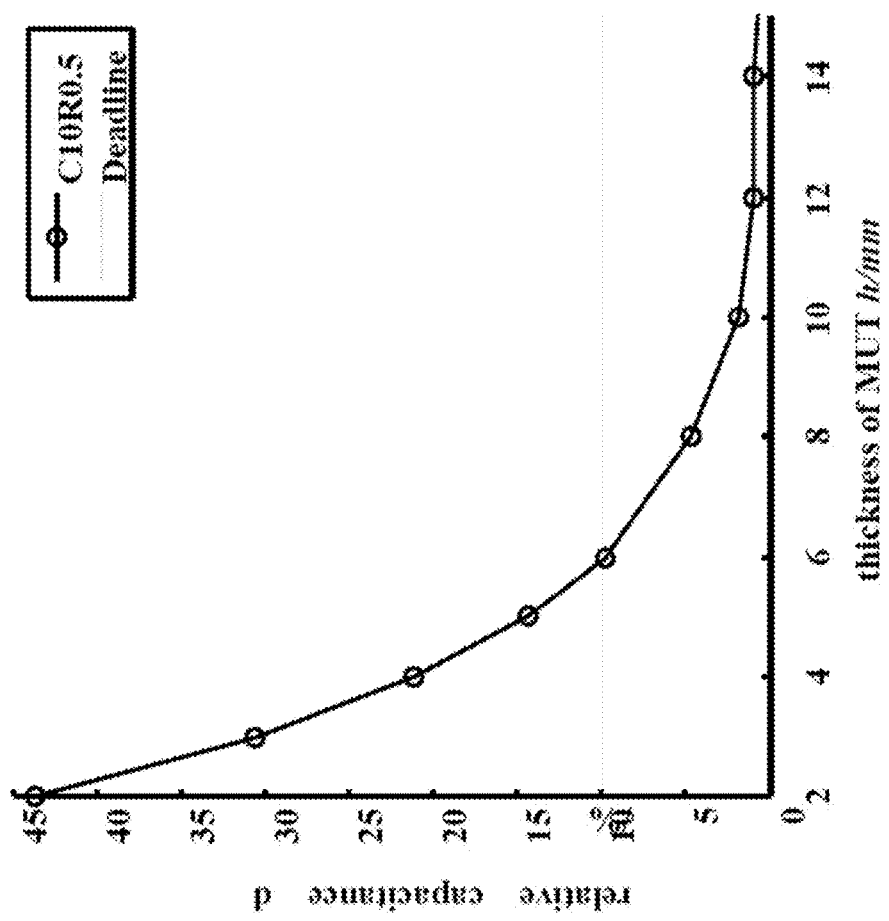
FIG. 6 shows relative capacitance value versus thickness of test samples for proximity interdigitated sensor with a single unit, whose metallization ratio is 0.5 and a vary unit width C.

Step 3: Computing the relative capacitance ratio to the constant value at each different MUT thickness. The capacitance values at different silicone rubber thicknesses obtained in step 2 are calculated according to formula (1), and the rate of change of the capacitance value relative to the stable value under the thickness h of the sample to be measured is shown in FIG. 6.

Step 4: Computing the penetration depth curves of the interdigitated capacitive proximity sensors with a single unit. Based on step (3), a 10% is selected as the difference %, and a horizontal line is drawn as shown in the dashed line in FIG. 6. The h-value corresponding to the intersection of the dashed line and the change rate curve of the capacitance value with respect to the stable value at different thickness of the sample to be tested is 6.03 mm, which is the effective penetration of the sensor with the unit width C is 10 mm and the metallization ratio is 0.5.

Figure 7:
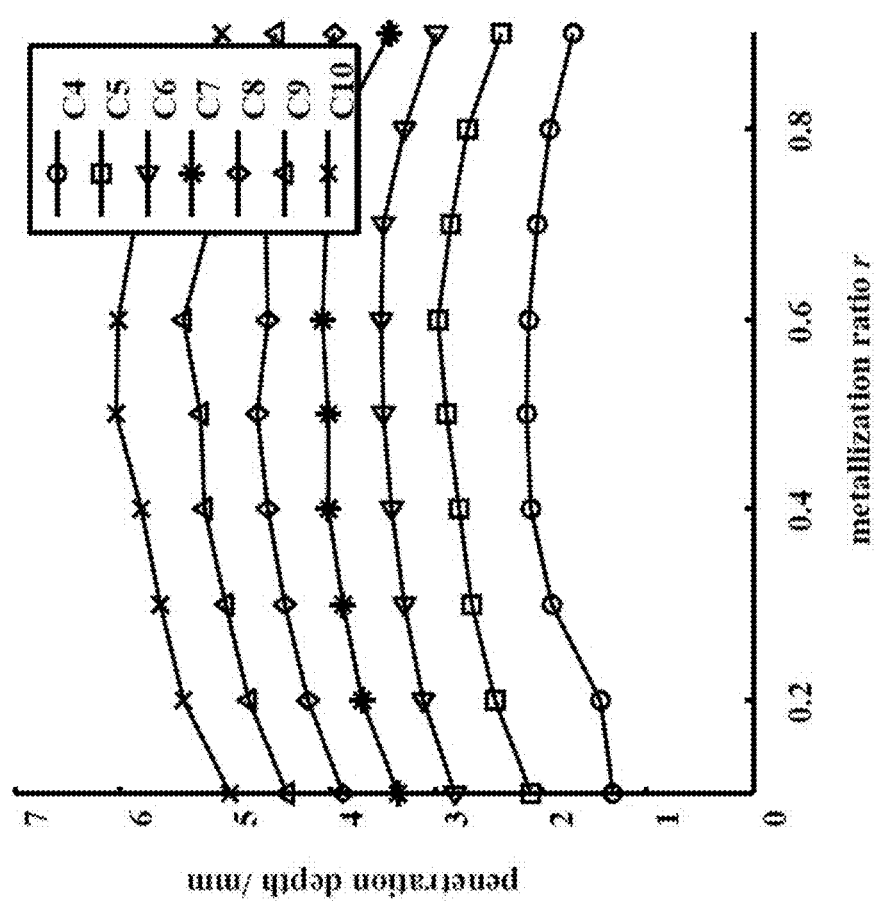
FIG. 7 shows penetration depth curves for capacitive proximity interdigitated sensors with different unit widths.
Figure 8:
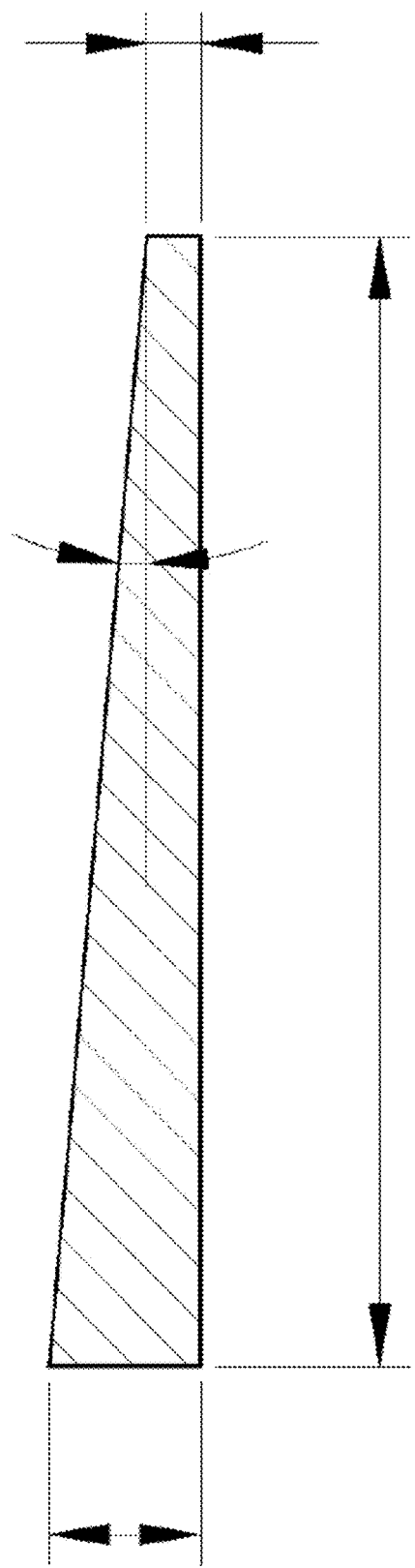
FIG. 8 shows the cross-sectional drawing of the specimen under test.

Step 5: Repeating steps (1) to (4), the different single unit capacitive sensors are fabricated. The unit width C is 4 mm\5 mm\6 mm\7 mm\8 mm\9 mm\10 mm, and the metallization ratio are 0.1~0.9. Measure and calculate the effective penetration depth of the sensor under different combinations of parameters, plotted as shown in FIG. 7.

Figure 9:
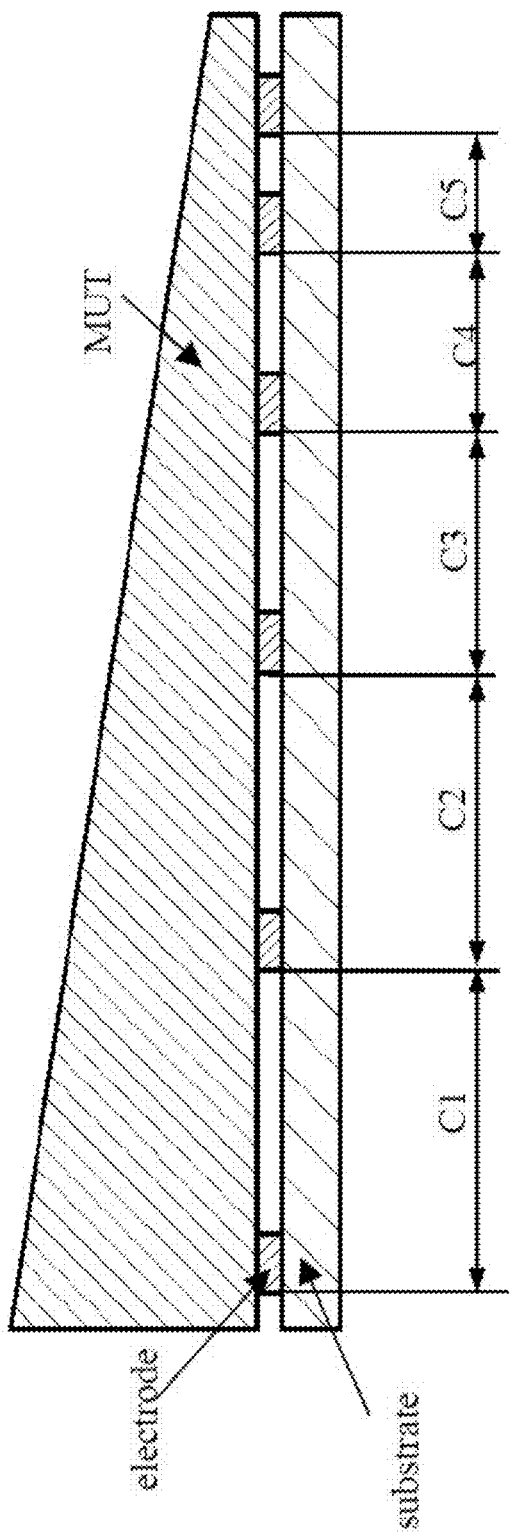
FIG. 9 shows installation diagram of the VS-IDE sensor and the thickness gradually changed MUT.
Figure 10:
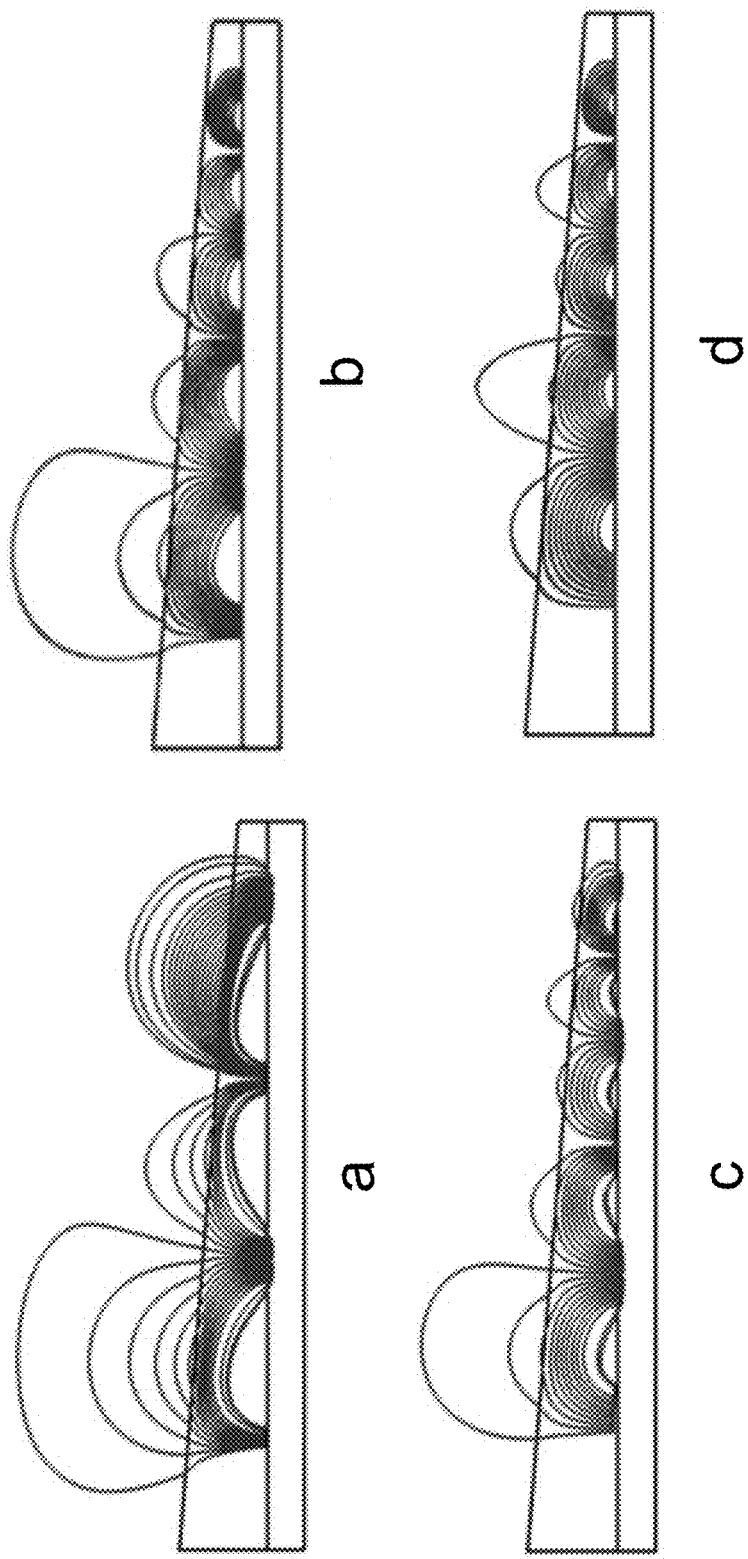
FIG. 10 shows electric field line distributions. (a), electric field line distribution for ES-IDE sensors; (b), electric field line distribution for VS-IDE sensor with metallization ratio 0.5; (c), electric field line distribution for VS-IDE sensor with metallization ratio 0.6; (d), Electric field line distribution for VS-IDE sensor with metallization ratio 0.7.

Step 6: Determining the width and spacing of each interdigitated unit, and combine to obtain a novel structure interdigitated capacitive proximity sensor with a variable spacing electrode. Analysis of the characteristics of the geometric dimensions of the thickness decrease specimen gradually to be measured as shown FIG. 8. As shown in the FIG. 8, the thickest part to be tested is 6.27 mm, and the thinnest thickness is 2 mm, the angle between the inclined surface and the horizontal direction is about 5 degree, the horizontal length is 46 mm. The first pair of finger units is arranged at a distance of 5 mm from the left end of the specimen to be measured, where the maximum thickness of the test piece to be tested is 5.89 mm. It is determined that when the metallization ratios are 0.5/0.6/0.7, and the cell width C is 10 mm, the penetration depth of the sensor can meet the requirements, and three different combinations of variable pitch interdigitated sensors are obtained. FIG. 9 shows the relative position of the VS-IDE sensor, and the thickness gradually changed specimen to be tested. When the metallization ratio is 0.5, select C1=10 mm, C2=8 mm, C3=6 mm, C4=5 mm and C5=4 mm are selected. When the metallization ratio is 0.6, C1=10 mm, C2=8 mm, C3=6 mm, C4=5 mm and C5=4 mm are selected. When the metallization ratio is 0.7, C1=10 mm, C2=8 mm, C3=7 mm, C4=6 mm and C5=5 mm are selected. Finally, the detailed parameters of each designed VS-IDE sensors are shown in Table 1, Table 2 and Table 3 respectively, and the sensors are fabricated as the structure shown in FIG. 1.

Figure 11:
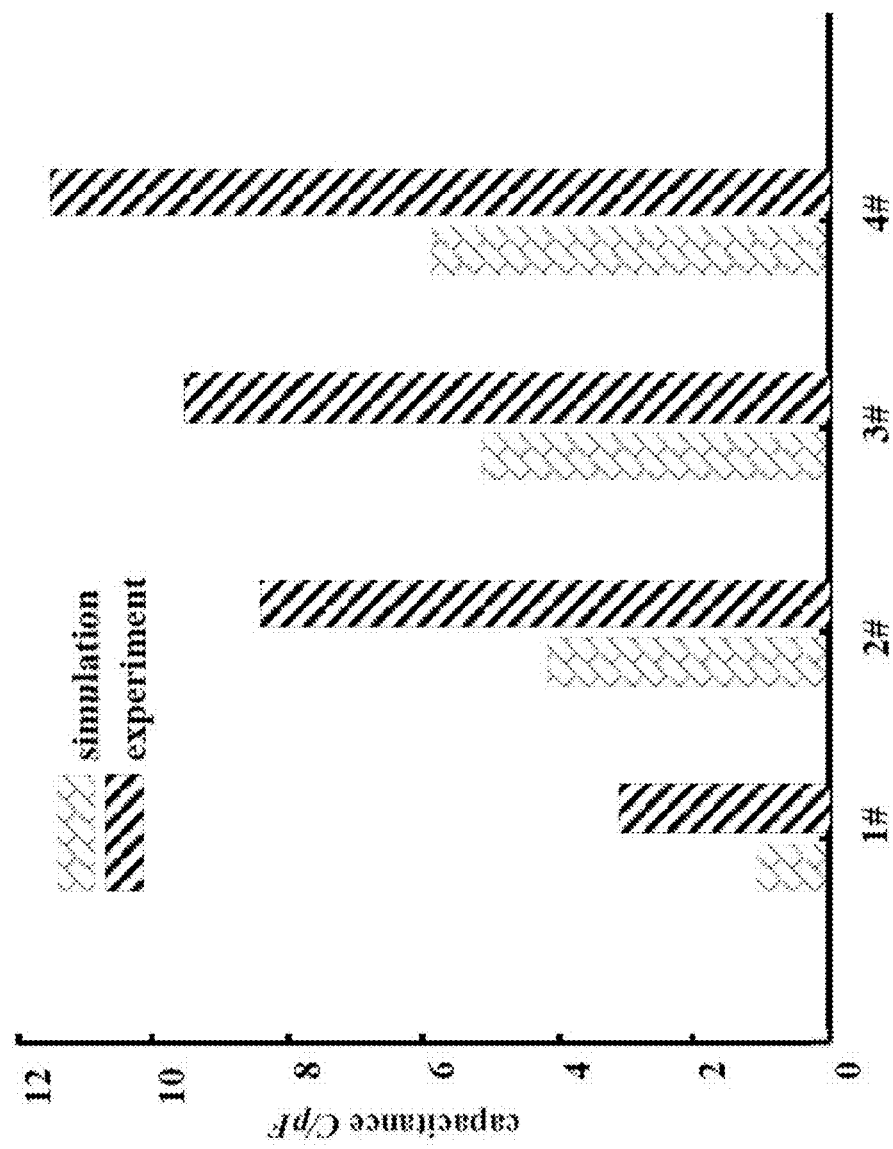
FIG. 11 shows Comparison of the signal strength between the VS-IDE sensors and ES-IDE sensor.

Step 7: Optimizing selection of the proximity interdigitated sensors with variable spacing electrode structure. FIG. 10a-10d show the distribution of the electric field lines of different types of sensors. The distribution of the electric field lines of the VS-IDE sensors is better than that of the traditional ES-IDE sensor. The experimental system is constructed as shown in the FIG. 2, which includes gradually changed thickness specimen 6, an impedance analyzer 7 and a VS-IDE sensor 8. The impedance analyzer 7 is connected to the interdigitated capacitive sensor 8, the signal strength of the sensor of the three variable pitch combinations measured by the impedance analyzer 7 is shown in FIG. 11. Combination 1 has a metallization ratio of 0.5, combination 2 has a metallization ratio of 0.6, and combination 3 has a metallization ratio of 0.7. Compare the three combinations; the maximum signal strength is 11.49 pF when the metallization is 0.7. And its signal strength is 3.7 times than ES-IDE structure sensor. Finally, the sensor-3 with metallization ratio 0.7 was selected due to the maximum signal strength while satisfying the requirement of penetration depth.

The above is a typical application of the present disclosure, and the application of the present disclosure is not limited thereto.

TABLE 1

| Interdigitated width | 5 mm | 5 mm | 4 mm | 3 mm | 2.5 mm | 2 mm |
|---|---|---|---|---|---|---|
| Spacing | | 5 mm | 4 mm | 3 mm | 2.5 mm | 2 mm |

TABLE 2

| Interdigitated width | 6 mm | 5 mm | 4.8 mm | 3.6 mm | 3 mm | 2.4 mm |
|---|---|---|---|---|---|---|
| Spacing | | 4 mm | 3.2 mm | 2.4 mm | 2 mm | 1.6 mm |

TABLE 3

| Interdigitated width | 7 mm | 5.6 mm | 4.9 mm | 4.2 mm | 3.5 mm | 2 mm |
|---|---|---|---|---|---|---|
| Spacing | | 3 mm | 2.4 mm | 2.1 mm | 1.8 mm | 1.5 mm |

What is claimed is:

1. An interdigitated capacitive proximity sensor with a varied space electrode structure, the sensor comprising:
a driving electrode, a sensing electrode, a PMMA (polymethyl methacrylate) substrate, a guarding electrode, and a lead connector, wherein: the driving electrode and the sensing electrode are deposited on the PMMA substrate, the guarding electrode is deposited on the opposite side of the PMMA substrate, the lead connector is welded on the guarding electrode to provide a reliable connection for the interdigitated capacitive proximity sensor and testing equipment, the driving and sensing electrodes including several interdigitated fingers, which are arranged alternately in sequence, and a width and metallization ratio for each interdigitated unit of the interdigitated capacitive proximity sensor are determined by a local thickness of a test sample, a "U" pattern slot is reserved on the PMMA substrate between connectors of the driving electrode and the sensing electrode, and an arrangement is suited for the driving electrode and sensing electrode, middle pins of Sub-Miniature version B (SMB) connectors are respectively connected to the driving electrode and the sensing electrode through pre-reserved holes on the substrate, and outside pins of the SMB connectors are connected to the guarding layer; and
a variable spacing interdigital electrode (VS-IDE) structure, wherein design steps of the width and spacing of each interdigitated unit of the interdigitated capacitive proximity sensor are as follows: parameters of the sensor including a unit width of each finger w, a length of the interdigitated electrode structure l, a spacing between two adjacent fingers g, a metallization ratio γ, a basic interdigitated unit C, the metallization ratio γ is equal to the ratio of the finger width w to the basic interdigitated unit width C, which is γ=w/(w+g), the design steps including:

Step 1: making sensors such that basic unit width of the sensor is C and the metallization ratio is γ, the sensors including the driving electrode, the sensing electrode, the substrate and guarding electrode, and the electrode width is w=C*γ, and the spacing between two adjacent electrodes is g=C*(1−γ), and the guarding layer width is C, Step 2: measuring capacitance values in the case of different thickness MUT, a series of different thickness MUT are placed on surfaces of the sensors fabricated in step 1 respectively, and the relevant capacitance is recorded simultaneously, Step 3: computing the relative capacitance ratio to the constant value at each different MUT thickness, an evaluation of the penetration depth is according to the distribution of the relative capacitance ratio d %, which is represented as $$d\% = \frac{|C_h - C_{h\to\infty}|}{C_{h\to\infty}} \times 100\%, \quad (1)$$

wherein $C_{h\to\infty}$ is a stable capacitance at the same metallization ratio, and the relative capacitance ratio curves are obtained, Step 4: computing penetration depth curves of the sensors with single unit, based on Step 3, d % equals to 10% when a horizontal line is drawn, and an effective penetration depth corresponds to the position where the relative capacitance equals 10%, Step 5: repeating the above steps 1 to 4 and the effective penetration depth curves for the sensors with a single unit to measure effective penetrative depth h, whose unit width and metallization ratio are C and γ respectively, Step 6: determining a width and spacing of each interdigitated units based on the effective penetrative depth h to obtain VS-IDE structure capacitive sensors, and Step 7: optimizing selection of the sensor by measuring performance of the VS-IDE structure capacitive sensors obtained based on the step 6 and selecting an optimal VS-IDE structure sensor according to an electric field line distribution and signal strength associated with the VS-IDE structure capacitive sensors.

2. The sensor of claim 1, wherein the PMMA substrate is a kind of insulation material with a certain strength and stiffness to support the electrode and guarding layer, a hole is drilled on the PMMA substrate for the purpose to lead the driving electrode and sensing electrode to the reverse side of the PMMA substrate.

\* \* \* \* \*